(12) United States Patent
Li

(10) Patent No.: US 6,904,087 B2
(45) Date of Patent: Jun. 7, 2005

(54) ADAPTIVE MULTI-MODULUS ALGORITHM METHOD FOR BLIND EQUALIZATION

(75) Inventor: Sung-Chiao Li, Yonghe (TW)

(73) Assignee: Via Technologies, Inc., Taipei (TW)

(*) Notice: Subject to any disclaimer, the term of this patent is extended or adjusted under 35 U.S.C. 154(b) by 0 days.

(21) Appl. No.: 10/657,238

(22) Filed: Sep. 9, 2003

(65) Prior Publication Data

US 2004/0052309 A1 Mar. 18, 2004

(30) Foreign Application Priority Data

Sep. 17, 2002 (TW) .................................... 91121267 A

(51) Int. Cl.⁷ ................................................ H03H 7/30
(52) U.S. Cl. .................................... 375/232; 708/323
(58) Field of Search ................................. 375/229, 230, 375/232, 233, 350; 708/323

(56) References Cited

U.S. PATENT DOCUMENTS

| | | | | |
|---|---|---|---|---|
| 5,809,074 A | * | 9/1998 | Werner et al. | 375/233 |
| 5,835,731 A | * | 11/1998 | Werner et al. | 375/235 |
| 6,069,917 A | * | 5/2000 | Werner et al. | 375/233 |
| 6,314,134 B1 | * | 11/2001 | Werner et al. | 375/232 |
| 6,493,381 B1 | * | 12/2002 | Werner et al. | 375/232 |

OTHER PUBLICATIONS

"A Dynamic Convergence Analysis of Blind equlization Algorithms" Garth IEEE vol. 49. No. 4, Apr. 2001 pp. 624–634.*

* cited by examiner

*Primary Examiner*—Temesghen Ghebretinsae
(74) *Attorney, Agent, or Firm*—Rabin & Berdo, P.C.

(57) ABSTRACT

A method of adaptive multi-modulus equalization for an equalizer. A cost from a cost function is calculated according to a constant modulus algorithm (CMA). Equalizer coefficients are updated according to the cost, and modulus of each region is determined for a multi-modulus algorithm (MMA). The equalizer is switched to use the MMA when the cost reaches a first threshold. The MMA comprises several stages determined by thresholds, and the number of regions increases in every stage. The cost is calculated according to the MMA and modulus of each region. The equalizer coefficients are updated according to the cost, and modulus of each region is determined for the subsequent stage of the MMA. The equalizer is switched to the subsequent stage of the MMA when the MMA cost function output reaches the threshold corresponding to the current stage. The steps are repeated until the cost reaches a preset value. Then, the number of regions and equalizer coefficients are fixed to equalize the input signal.

19 Claims, 19 Drawing Sheets

ADAPTIVE MULTI-MODULUS ALGORITHM METHOD FOR BLIND EQUALIZATION

BACKGROUND OF THE INVENTION

1. Field of the Invention

The present invention relates to a method of blind equalization in a receiver and particularly to an adaptive multi-modulus equalization method.

2. Description of the Related Art

Signals transmitted through a real voice-band channel suffer from non-ideal channel characteristics such as Additive White Gaussian Noise (AWGN), Inter Symbol Interference (ISI), fading, and phase distortion. These non-ideal channel characteristics seriously degrade and distort the original signals. When a signal passes through a particular channel, the receiver can model the effect of the channel as a filter with a transfer function H(z). To overcome the non-idea channel characteristics, the receiver thus designs an adaptive filter with a transfer function $H^{-1}(z)$. $H^{-1}(z)$ is the inverse transfer function of H(z), and multiplying $H^{-1}(z)$ to the signal with channel effect recovers the original signal by canceling H(z). The expected response of combining the adaptive filter with the real voice-band channel is an impulse response in the time domain, and constant over all frequency range in the frequency domain. The adaptive filter described is referred to as an equalizer. An ideal equalizer recovers signals passed through the real voice-band channel, and completely removes the channel effect.

The coefficients of the equalizer, also referred as tap weights, determine the transfer function of the equalizer. The tap weights need to be adjusted and updated frequently to minimize error at the output of the equalizer. This error is effectively a measure of the difference between the actual output of the equalizer and the expected output. Generally speaking, there are two ways of acquiring new tap weights for the equalizer. One is to transmit a training sequence known by both transmitter and receiver at the beginning of the communication. The receiver then detects the impulse response of the channel from the training sequence, and obtains the tap weights by computing the inverse transfer function of the channel. The other way is to predetermine an initial value for each of the tap weights, and design a cost function according to the characteristics of the received signal. The tap weights are continually adjusted by reducing the cost of the cost function until the error is minimized (i.e. until the equalizer converges). Equalizers implementing the second technique described above are referred to as "blind equalizers".

The channel effect varies, and an adaptive equalizer with adjustable transfer function is required to adapt any instantaneous change in the channel effect. The characteristics of the channel change slowly with temperature, movement of the receiver, and many other environmental factors. The adaptive equalizer continuously updates its transfer function by adjusting the tap weights to compensate for current channel effect. Blind equalization is considered more effective than non-blind equalization due to its ability to update the tap weights at any time without waiting for a training sequence.

Constant modulus algorithm (CMA) is a well-known technique used in blind equalization. The CMA algorithm converges an equalized signal on a constellation diagram with constellation points scattered evenly over several concentric circles. An attribute of the CMA algorithm is that the blind equalizer does require the number of valid coordinates on the constellation diagram.

The CMA algorithm defines a cost function to estimate channel noise in a received signal. The higher the output (cost) of the cost function, the larger the channel noise in the received signal. The equalizer first calculates an equalized signal by adding the products of the received signal and the tap weights. After obtaining the equalized signal, the cost function calculates the cost of the equalized signal. The cost indicates the noise level of the received signal, and this cost is used to adjust the tap weights of the equalizer. The equalizer then calculates a new equalized signal using the updated tap weights, and obtains a new cost from the new equalized signal. The cost of the cost function is expected to be reduced by repeating the above processes. The lower the cost, the lower the noise in the received signal.

The cost function of $p^{th}$ order (p is an integer greater than zero) is given by:

$$D^{(p)} = E[(|z_n|^p - R_p)^2] \qquad \text{Equ. (1)}$$

where $Z_n$ is the output (equalized signal) of the equalizer, and $R_p$ is a positive constant. The equation used to calculate the least-mean-squares (LMS) error can also be the cost function for adjusting the tap weights. The LMS error is given by:

$$\text{Error} = E[(z_n - a_n)^2] \qquad \text{Equ. (2)}$$

While there is a great similarity between equation (1) and equation (2), an expected output an of the equalizer, the original signal without channel noise, must be known in advance when using the LMS cost function. The LMS cost function is therefore not suitable for a monotonic demodulating system, as the original signal is unknown to the receiver.

An advantage of using the $p^{th}$ order cost function is the ability to achieve convergence without knowing the original signal in advance. By using the $p^{th}$ order cost function, $R_p$ is assumed to be the ideal output of the equalizer. However, $p^{th}$ order cost function minimizes the difference between $R_p$ and $|Z_n|^p$, which takes longer to achieve convergence than the LMS technique. Another drawback to $P^{th}$ order cost function is that carrier phase distortion cannot be recovered.

FIG. 1 is a diagram illustrating the ISI effect on a signal. ISI is considered to cause the most serious distortion to the signal compared to other types of channel noise. Locations of white dots therein represent coordinates of an original signal without ISI interference on a constellation diagram. The original signal interferes with ISI when transmitting on a physical channel, causing the coordinates of the received signal to shift locations of black dots on the constellation diagram. As shown in the diagram, the black dots represent coordinates of the signal with ISI interference. The cost, that is the output of the cost function, of the original signal is $2a^2$, whereas the cost of the signal with ISI is $2a^2 + 4c^2$. The difference of $4c^2$ indicates that the cost of the signal with ISI is greater than that of the original signal.

Adjusting the coefficients (tap weights) of the equalizer can reduce costs and cancel the effects of ISI interference. The steepest gradient descent method is a possible solution for adjusting the tap weights to minimize the cost of the cost function. Equations (3), (4), and (5) show the formula for adjusting the tap weights.

$$c_{n+1} = c_n - \lambda_p \left[ \frac{\partial D^{(p)}}{\partial c} \right]_{c=c_n} \qquad \text{Equ. (3)}$$

-continued $$p = 1 \quad c_{n+1} = c_n - \lambda_1 y_n \cdot z_n \left(1 - \frac{R_1}{|z_n|}\right) \quad \text{Equ. (4)}$$

$$\text{wherein } R_1 = \frac{E(a_m^2)}{E(|a_m|)}$$

$$p = 2 \quad c_{n+1} = c_n - \lambda_2 y_n \cdot z_n (|z_n|^2 - R_2) \quad \text{Equ. (5)}$$

$$\text{wherein } R_2 = \frac{E(|a_m|^4)}{E(|a_m|^2)}$$

where $c_n$ is a vector of the tap weights, $\lambda_1$ and $\lambda_2$ are adjusting coefficients, $y_n$ is an input signal, $z_n$ is an equalized signal (output of the equalizer), $R_p$ is a positive number determined by the pattern of the constellation diagram, and $a_m$ represents the exact coordinates on the constellation diagram. Simulations show that the convergence of tap weights is faster and more accurate when using the second order (P=2) cost function rather than the first order (p=1) cost function.

Drawbacks of the CMA algorithm include the performance of convergence for a Quadrature Amplitude Modulation (QAM) signal degrading with the number of valid coordinates on the constellation diagram. FIG. 2 shows the output of a CMA equalizer for a signal modulated by 896-QAM. There are 896 valid coordinates on the constellation diagram for a 896-QAM signal. As shown in FIG. 2, detecting each constellation point on the constellation diagram becomes impossible if the number of valid coordinates is too large.

SUMMARY OF THE INVENTION

The object of the present invention is to provide an adaptive multi-modulus equalization method for a blind equalizer which overcomes the disadvantages of existing methods.

The adaptive multi-modulus equalization method for an adaptive equalizer proposed in the present invention comprises the following steps. First, an input signal is stored and initial values for a plurality of equalizer coefficients (tap weights) are set. Then, the input signal is passed into the adaptive equalizer to generate an equalized signal. A cost is then calculated by substituting the equalized signal into a preset cost function. The cost is used to derive an adjustment amount for updating the tap weights of the adaptive equalizer. These steps are identical to the CMA algorithm in the prior to allow the tap weights to be updated for cost reduction. The adaptive equalizer switches to implementation of a multi-modulus algorithm (MMA) rather than the CMA algorithm when the cost is reduced to reach a first threshold. The MMA algorithm divides the constellation diagram into a plurality of regions, and the number of regions increases when switching to the subsequent stage. A key feature of the present invention is that there are stages with different numbers of regions. Modulus of each region for the subsequent stage is determined by statistical analysis of the equalized signal generated by the equalizer.

The stored signal passes through the adaptive equalizer again when the equalizer switches to the MMA algorithm. According to the MMA algorithm, the cost is now calculated regarding the equalized signal generated by the adaptive equalizer, as well as moduli of the corresponding regions. Then, an adjustment amount is derived by the cost, and is used to update the tap weights of the equalizer. The tap weights are continuously adjusted to reduce the cost. The adaptive equalizer switches to the subsequent stage when the cost reaches the threshold of the current stage. The thresholds are preset to switch to subsequent stages. The adaptive equalizer repeats the process of convergence by continuously updating the tap weights, reducing the cost, and switching to the subsequent stage until a desired value for the cost function output (cost) is reached. When the cost reaches the desired value, the number of regions and tap weights are fixed and the received signal is equalized thereby.

These and other objectives of the present invention will be obvious to those of ordinary skill in the art after reading the following detailed description of the preferred embodiment, illustrated in the various Figures and drawings.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE INVENTION

Figure 1:
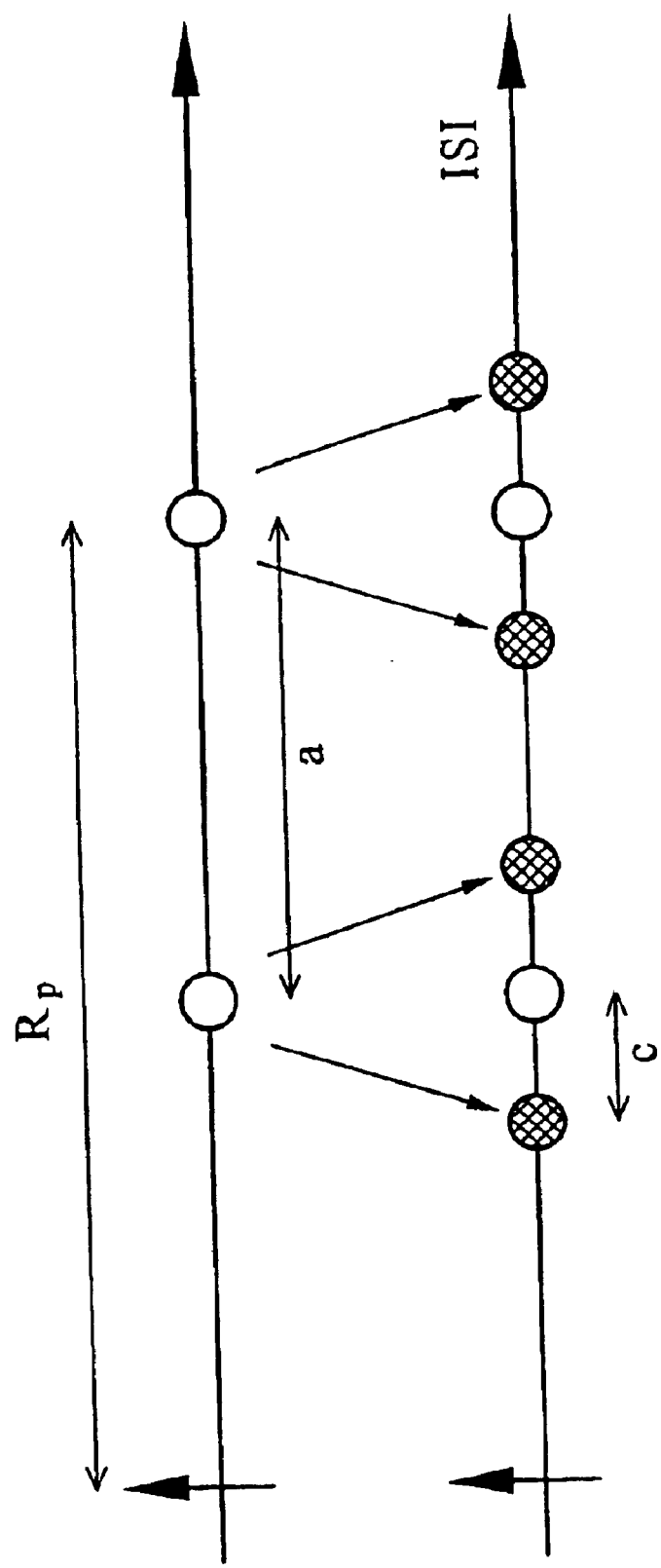
FIG. 1 is a diagram illustrating the ISI effect on a signal.
Figure 2:
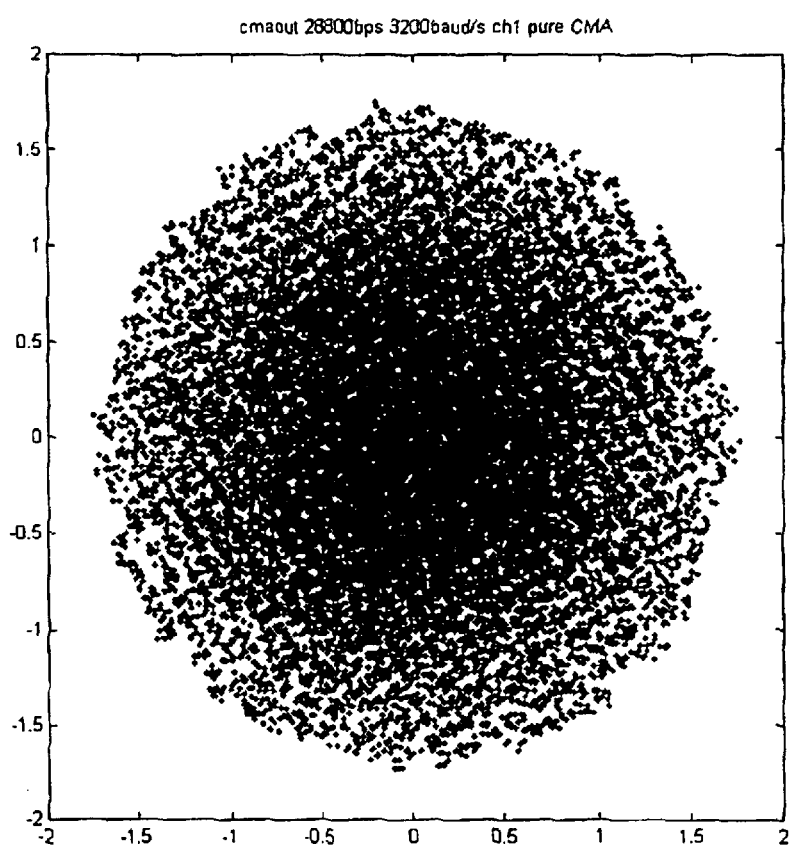
FIG. 2 is a constellation diagram illustrating an output of a CMA equalizer when receiving an 896-QAM signal.
Figure 3:
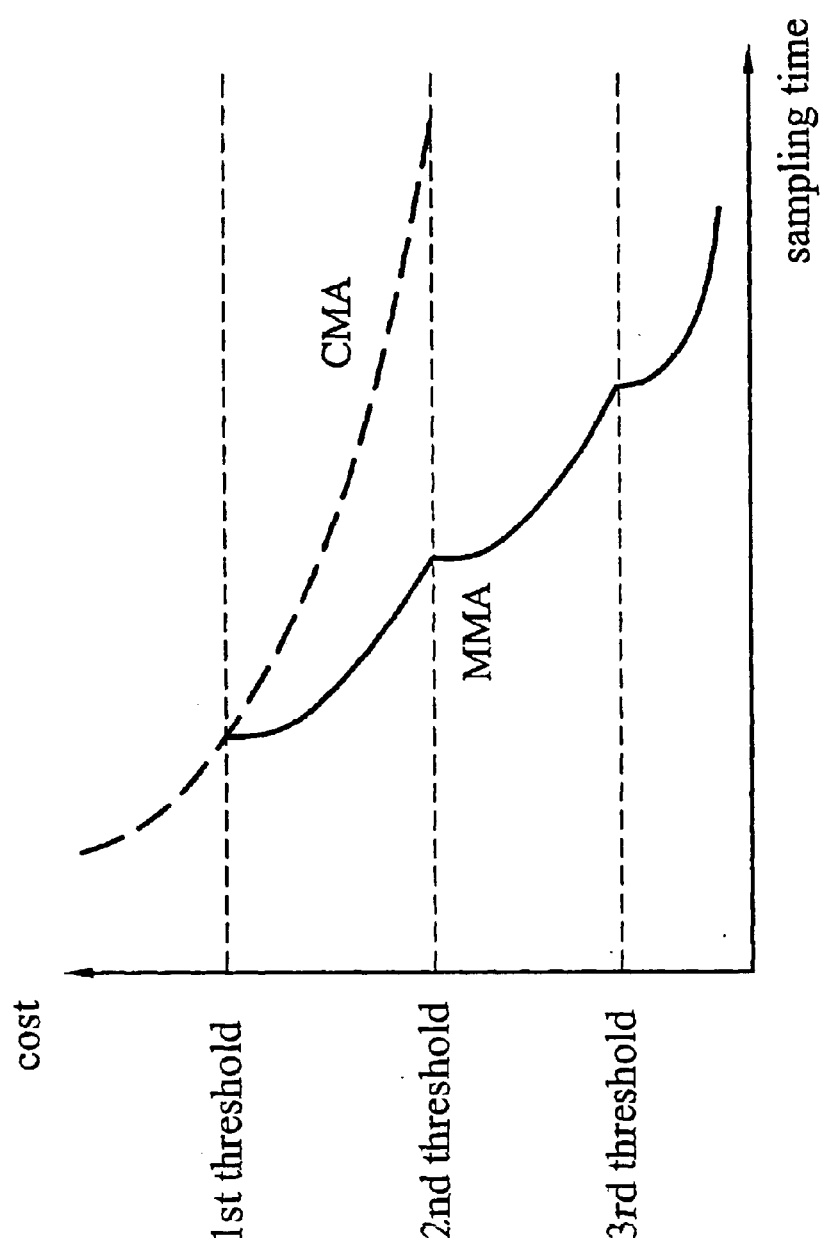
FIG. 3 is a graph comparing the performance and the convergence rate between a CMA algorithm and an adaptive MMA algorithm.

FIG. 3 shows a convergence rate for the adaptive MMA algorithm exceeds the CMA algorithm as the adaptive MMA algorithm has multiple stages. By switching to subsequent stages, the convergence rate is increased because the constellation diagram is divided into more regions. A distance between any valid coordinate and its corresponding modulus is decreased by allowing more regions on the constellation diagram. Costs can be reduced more effectively by minimizing this distance, as explained later in detail. The adaptive MMA algorithm solves the problem of unacceptable convergence performance for QAM signals with large numbers of valid coordinates on the constellation diagram.

Figure 4:
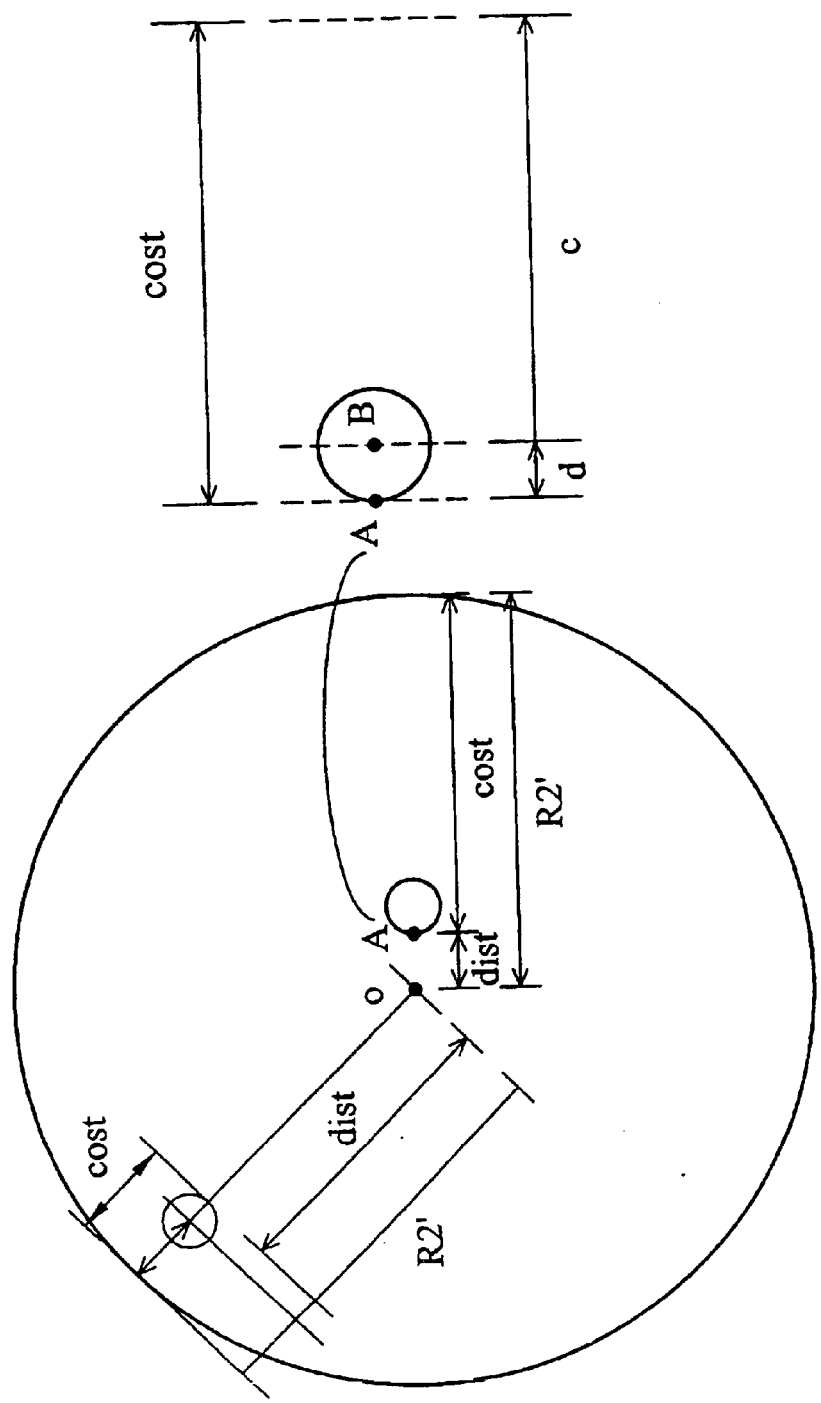
FIG. 4 is a diagram illustrating a cost function of the CMA algorithm.

FIG. 4 is a constellation diagram illustrating a cost function. According to the CMA algorithm, all constellation points fall in an area bounded by a circle with a centre o and a radius R2'. The area of the circle is referred to as region and the circumference of the circle as modulus on the constellation diagram. The radius R2' is limited by an automatic gain control of the receiver, which limits the space between constellation points. As shown in FIG. 4, an equalized signal falls into point A, and a closest valid coordinate on the constellation point is at point B. The intention of convergence is to close the distance d between point A and point B. An acceptable value for convergence of d decreases with increased valid coordinates on the constellation diagram. Controlling the distance d to within the acceptable limit helps identify the corresponding coordinates for every constellation point. The cost (output of a cost function) of point A is approximately the sum of d and c (d+c), where c is the distance between the closest valid coordinate (point B) and the modulus and c is a constant. Reducing the cost also reduces the distance d, and the cost can be reduced by implementing the steepest gradient descent method. The problem with the CMA algorithm is that c is a constant and cannot be reduced any further, hence the distance d becomes relatively small during reduction of the cost. The steepest gradient descent method cannot execute effectively and efficiently when the ratio of d to the cost becomes too small.

Figure 5B:
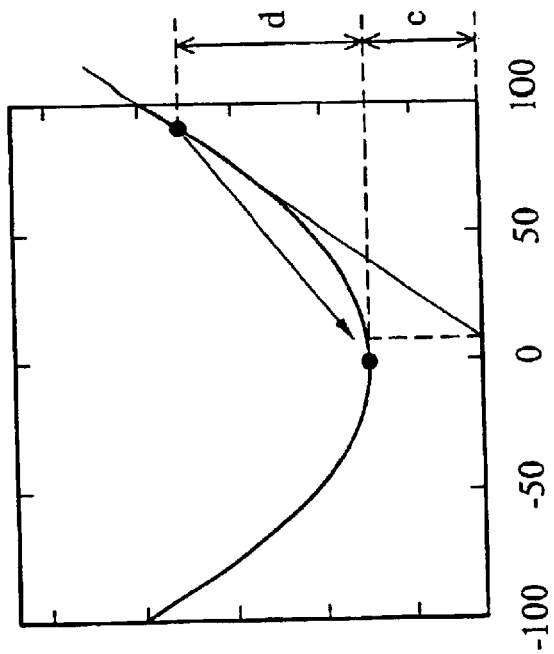
FIG. 5A and FIG. 5B are graphs illustrating two conditions of reducing the cost function using the steepest gradient descent method.
Figure 5A:
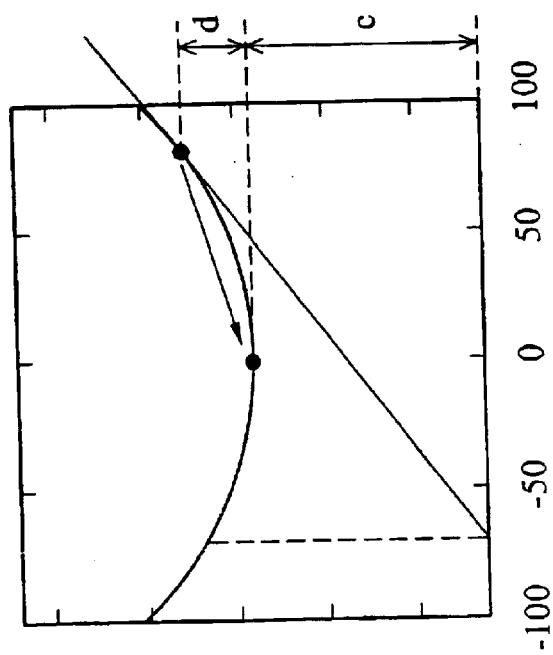

FIGS. 5A and 5B are graphs illustrating two types of condition for reducing the cost using the steepest gradient descent method. FIG. 5A demonstrates a condition in which c is larger than d, where FIG. 5B reduces the proportion of c. The two graphs show that the steepest gradient descent method effectively decreases the distance d in FIG. 5B as the gradient therein increases in steepness. Thereby, decreasing the proportion of c can speed the convergence of the cost.

The cost function is given by:

$$D^{(2)} = E[(|z_n|^2 - R_2)^2] \qquad \text{Equ. (6)}$$

$$\text{where } (R_2 - |z_n|^2)^2 = (\sqrt{R_2} + |z_n|)^2 \cdot (\sqrt{R_2} - |z_n|)^2 \qquad \text{Equ. (7)}$$

$$(R_2 - |z_n|^2)^2 \approx (\sqrt{R_2} + |z_n|)^2 \cdot [(\sqrt{R_2} - |S_n|)^2 + (|S_n| - |z_n|)^2] \qquad \text{Equ. (8)}$$

where $S_n$ is a valid coordinate on the constellation diagram, and $z_n$ is a coordinate of an equalized signal generated by the equalizer. Equation (8) approximates the cost function, wherein the second operand of the equation represents the sum of two distances. $(\sqrt{R_2} + |S_n|)^2$ represents the distance between the modulus and the valid coordinate closest to the coordinate of the equalized signal, is the distance c mentioned above. $(|S_n| - |z_n|)^2$ is the distance between the coordinate of the equalized signal and the closest valid coordinate, the distance d mentioned above. To ensure proper convergence of the equalized signal, the second operand of the equation must be reduced to an acceptable value. The acceptable value depends on the number of valid coordinates on the constellation diagram, such that increased valid coordinates implies stricter acceptable value. According to FIGS. 5A and 5B, the steepest gradient descent method is more effective if the distance c, $(\sqrt{R_2} + |S_n|)^2$ in equation (8) can be reduced. Multi-modulus technique proposed in the present invention reduces the distance c by dividing the constellation diagram into regions as shown in FIG. 6.

Figure 6:
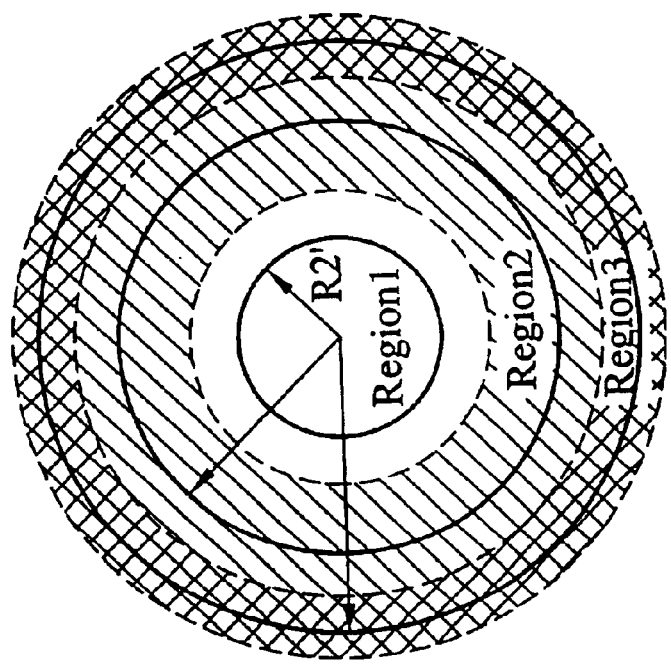
FIG. 6 is a constellation diagram illustrating regions and moduli in the MMA algorithm.

FIG. 6 is a constellation diagram illustrating regions and moduli in the multi-modulus algorithm (MMA). As shown in FIG. 6, the regions are concentric circles on the constellation diagram, each region having a corresponding modulus. In comparison with conventional methods using the same modulus for cost calculation, a different modulus is used when the equalized signal falls into a different region. The MMA algorithm reduces the distance between the modulus and the valid coordinate (distance c) by replacement with a modulus closer to the coordinate of the equalized signal. For example, the modulus closest to the centre of the circle is used when the equalized signal falls into region 1, and the largest modulus is used when the equalized signal falls into region 3. The distance c, the constant part of the cost function is hence reduced, speeding the process of convergence.

Figure 7:
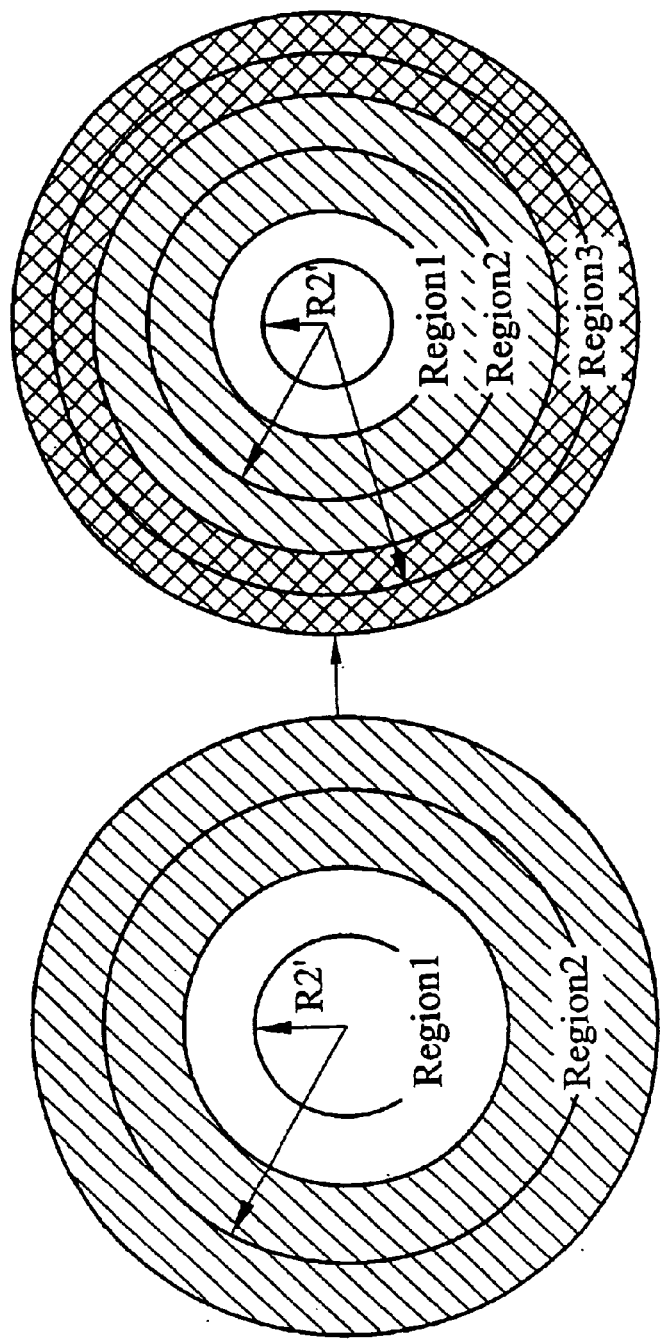
FIG. 7 illustrates the structural change of the constellation diagram when switching to the subsequent stage according to the adaptive MMA algorithm.

In the embodiment of the present invention, the number of regions gradually increases at each stage during convergence. FIG. 7 is an example of switching from one stage to the subsequent stage, in which the number of regions increases from two to three. Initially the constellation diagram contains only one region, as in the case of CMA algorithm. The first stage uses the CMA algorithm to estimate the convergence result. The modulus of each region for the subsequent stage may be estimated according to the following equation by analyzing the coordinates of the equalized signal in each region.

$$R_2 = \frac{E[|z_n|^4]}{E[|z_n|^2]} \approx \frac{E[|a_m|^4]}{E[|a_m|^2]} \qquad \text{Equ. (9)}$$

where $z_n$ represents the coordinates of the equalized signal. The modulus of each region for the subsequent stage is obtained by statistical analysis while converging the signal. The adaptive MMA algorithm has several thresholds for determining when to switch to the subsequent stage. For example, the adaptive MMA algorithm switches to the second stage with two regions when the cost reaches the first threshold, and to the third stage with three regions when the cost reaches the second threshold. The adaptive equalizer has a faster convergence rate when switching to the subsequent stage with more regions on the constellation diagram, whereas it is also possible to switch back to the previous stage with fewer regions if the cost increases during convergence rather than decreasing switching back to the previous stage avoids bottlenecks during convergence at a particular stage. A possible cause of bottleneck is the equalized signal continues to fall into the region boundaries.

The equation for calculating the modulus relates to the coordinates on the constellation diagram. The embodiment of the present invention estimates the modulus for each region according to the equalized signal. This ensures that the estimated moduli will not be affected by the number of symbols transmitted in the signal.

Figure 8:
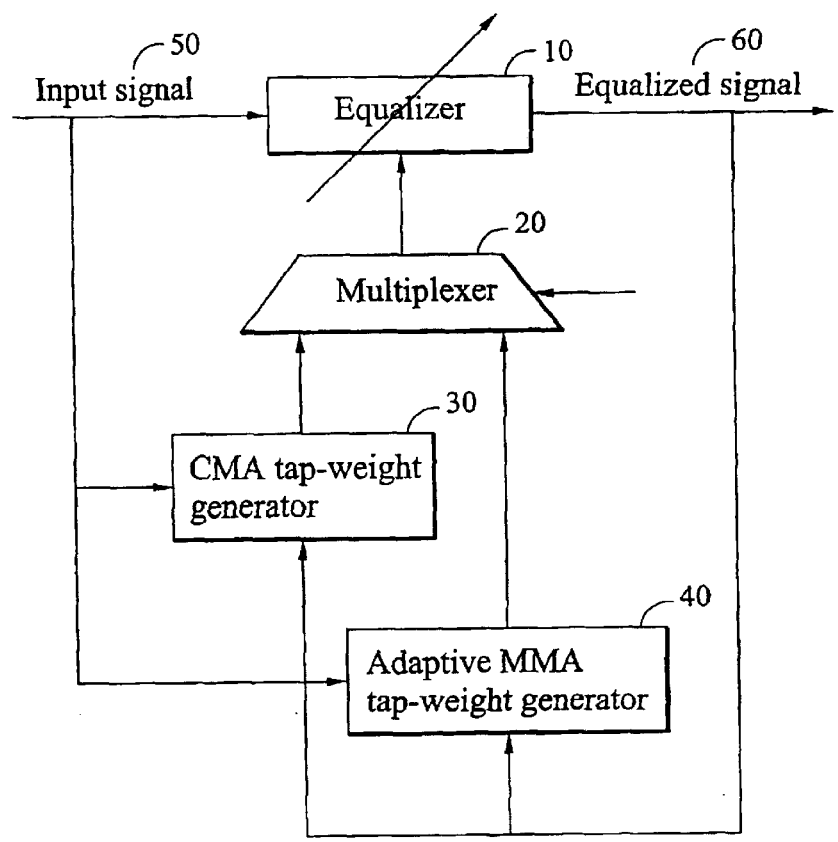
FIG. 8 is a block diagram illustrating a configuration of an adaptive equalizer of the present invention.

FIG. 8 is a block diagram illustrating an equalizing system for an adaptive equalizer using both the CMA algorithm and the adaptive MMA algorithm. The configuration of the equalizing system comprises an equalizer 10, a multiplexer 20, a CMA tap-weight generator 30, and an adaptive MMA tap-weight generator 40. The equalizer 10 equalizes an input signal 50 according to its coefficients. (tap weights). The coefficients of the equalizer 10 are updated according to tap weights generated by either the CMA tap-weight generator 30 or the adaptive MMA tap-weight generator. The multiplexer 20 first selects the tap weights generated by the CMA tap-weight generator 30 until the cost reaches the first threshold as discussed before.

Figure 9:
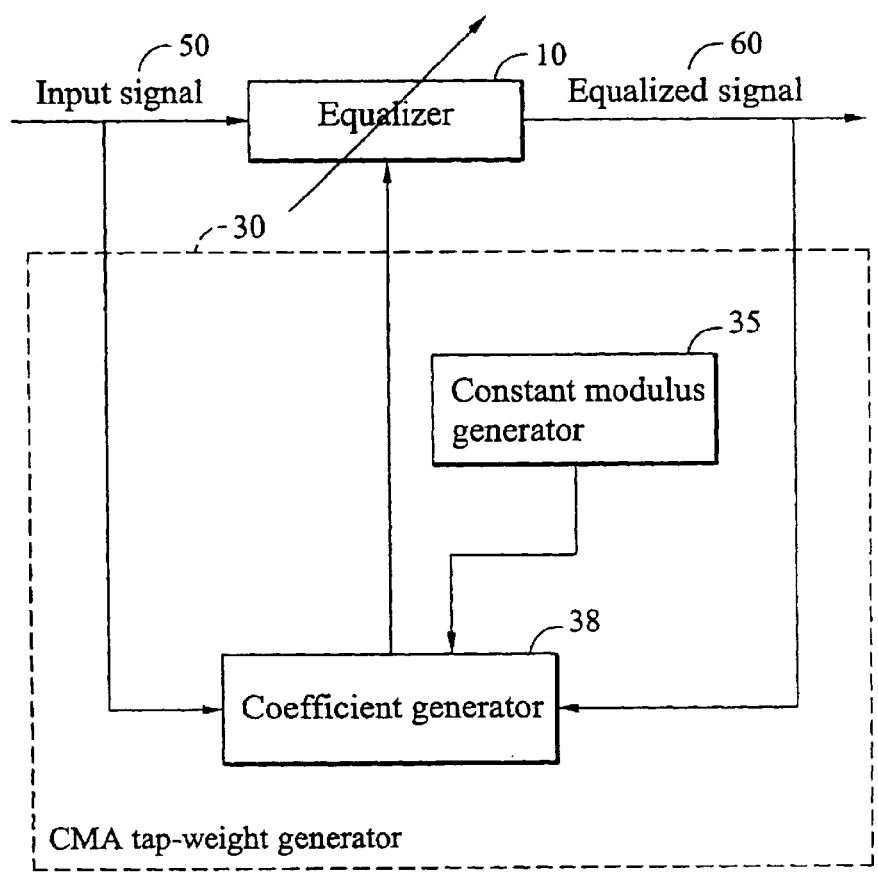
FIG. 9 is a block diagram illustrating a configuration of an equalizing system using the CMA algorithm.
Figure 10:
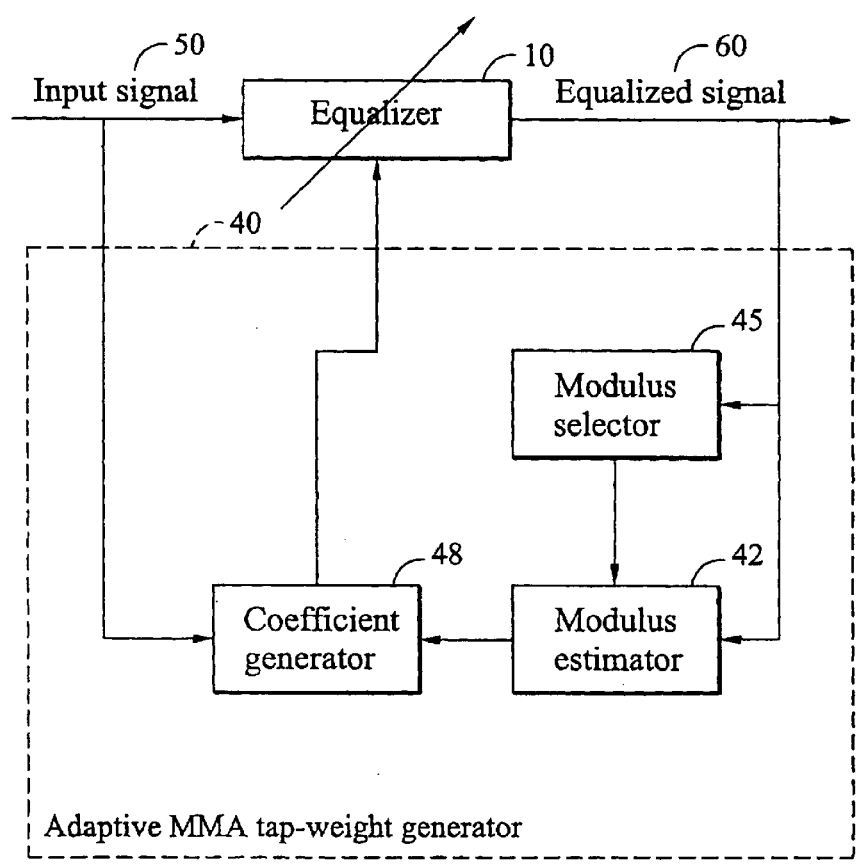
FIG. 10 is a block diagram illustrating a configuration of an equalizing system using the adaptive MMA algorithm.

FIGS. 9 and 10 show the configurations of the CMA tap-weight generator 30 and the adaptive MMA tap-weight generator 40 respectively. As shown in FIG. 9, the equalizer 10 receives new tap weights from a coefficient generator 38. The coefficient generator 38 calculates the new tap weights according to the input signal 50, an equalized signal 60 from the equalizer 10, and a corresponding modulus generated by a constant modulus generator 35. As shown in FIG. 10, the equalizer 10 receives new tap weights from the coefficient generator 48. The coefficient generator 48 calculates the new tap weights according to the input signal 50, the equalized signal 60, and an output signal of a modulus estimator 42. The modulus estimator 42 gathers information from the equalizer 10, and a modulus selector 45, and calculates modulus of each region for the subsequent stage.

Figure 11:
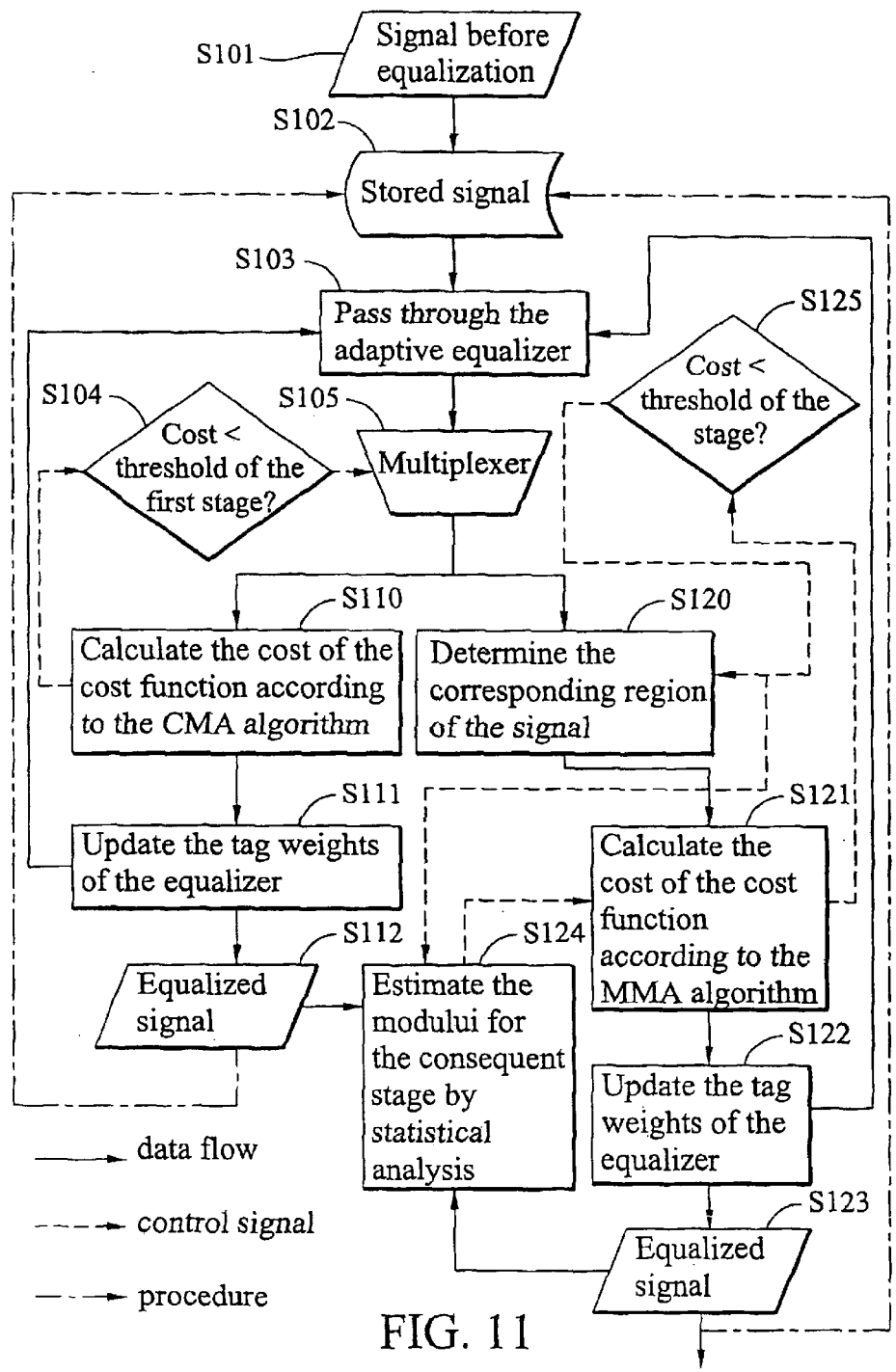
FIG. 11 is a flowchart illustrating an adaptive MMA equalization method according to the embodiment of the present invention.

FIG. 11 is a flowchart illustrating the algorithm of the equalization method according to the embodiment of the present invention. Step S101 receives an input signal for equalization, and step S102 stores the input signal. The input signal then passes through the adaptive equalizer of the present invention in step S103. The coefficients (tap weights) of the adaptive equalizer are first set to initial values, and will be modified later. Step S104 determines if the cost (output of the cost function) is reduced to a first threshold. Step S105 switches from the CMA algorithm to the MMA algorithm when the cost is less than the first threshold, otherwise, the equalizer continues to update the tap weights using the CMA algorithm. Step S110 calculates the cost according to the CMA algorithm, and step S111 sends the newly updated tap weights to the adaptive equalizers and continues updating the tap weights using the CMA algorithm until the cost is below the first threshold in step S104. Step S112 computes the equalized signal according to the CMA algorithm, and then step S124 estimates the moduli for the subsequent stage by statistical analysis of the equalized signal. When the adaptive equalizer starts to use the MMA algorithm, step S120 determines the corresponding region for each symbol in the input signal. The cost is now estimated using the MMA algorithm, and the moduli calculated in step S124 are used to calculate the cost in step S121. Step S122 updates the tap weights, and returns to step S103 to repeat the processes of updating the tag weights. When switching to a new stage, step S121 uses the moduli estimated in step S124 to calculate the cost. Switching between stages is determined by step S125, only switching to the subsequent stage when the cost is below a threshold corresponding to the current stage.

Figure 12:
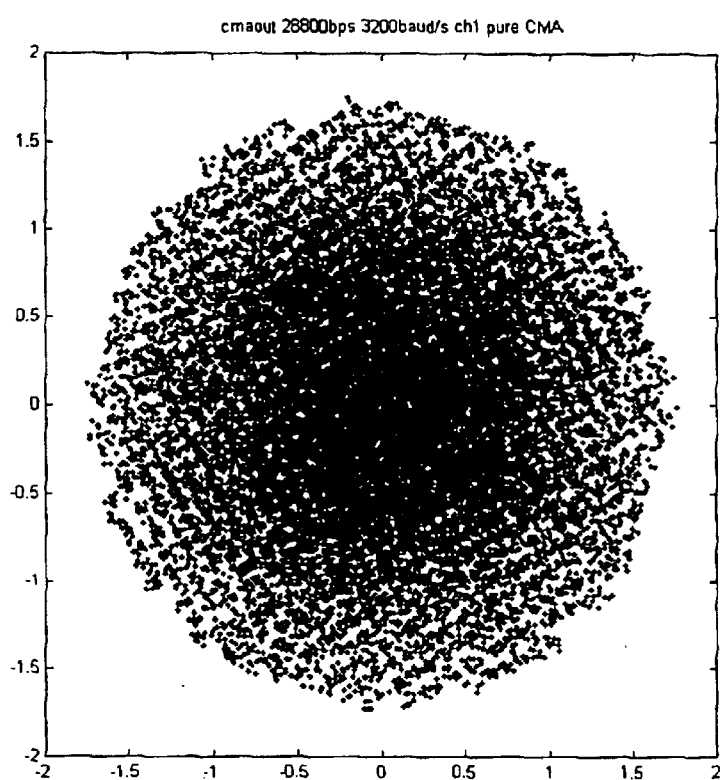
FIG. 12 is a constellation diagram illustrating an output of a CMA equalizer when receiving an 896-QAM signal.
Figure 13:
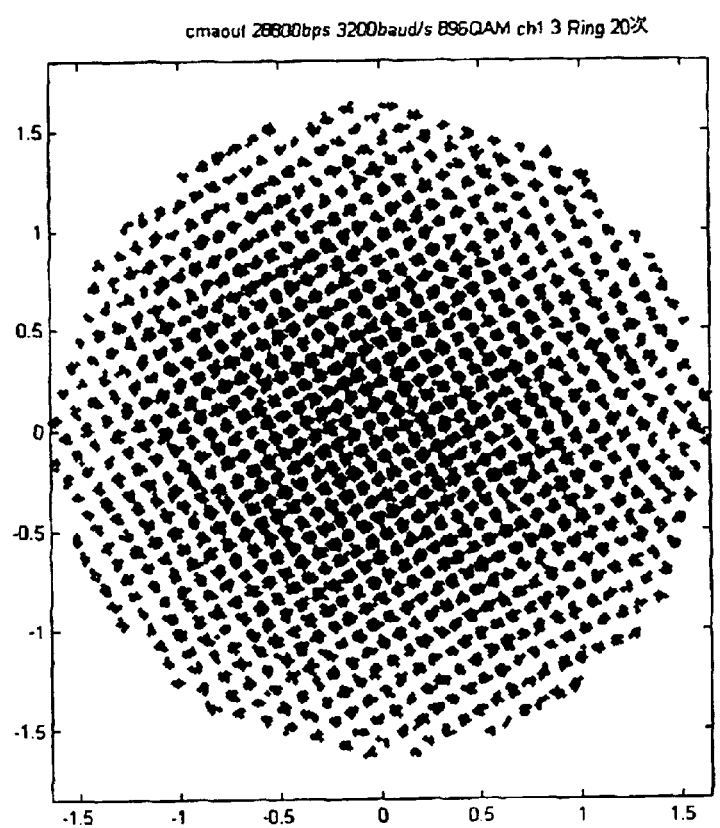
FIG. 13 is a constellation diagram illustrating an output of an adaptive MMA equalizer when receiving an 896-QAM signal.
Figure 14:
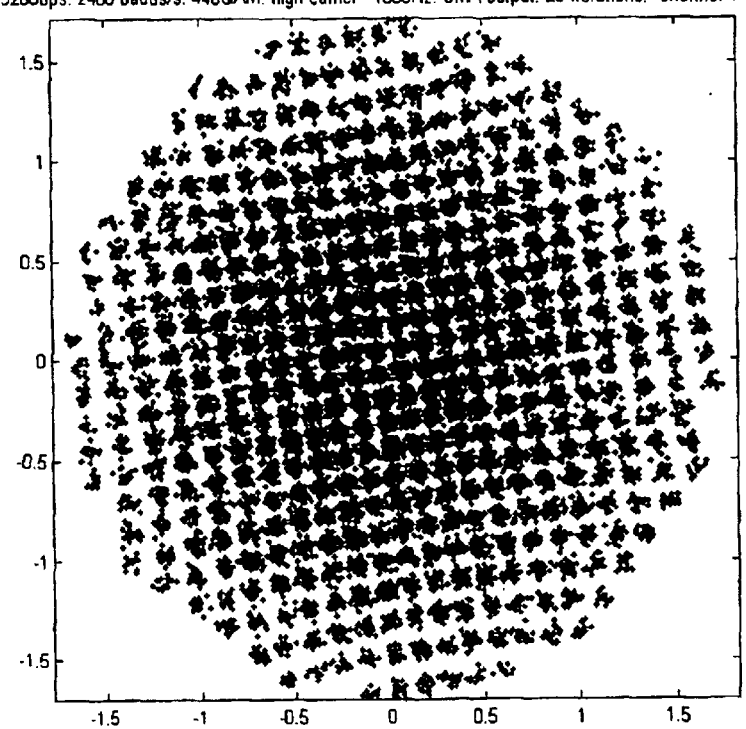
FIG. 14 is a constellation diagram illustrating an output of a CMA equalizer when receiving a 448-QAM signal.
Figure 15:
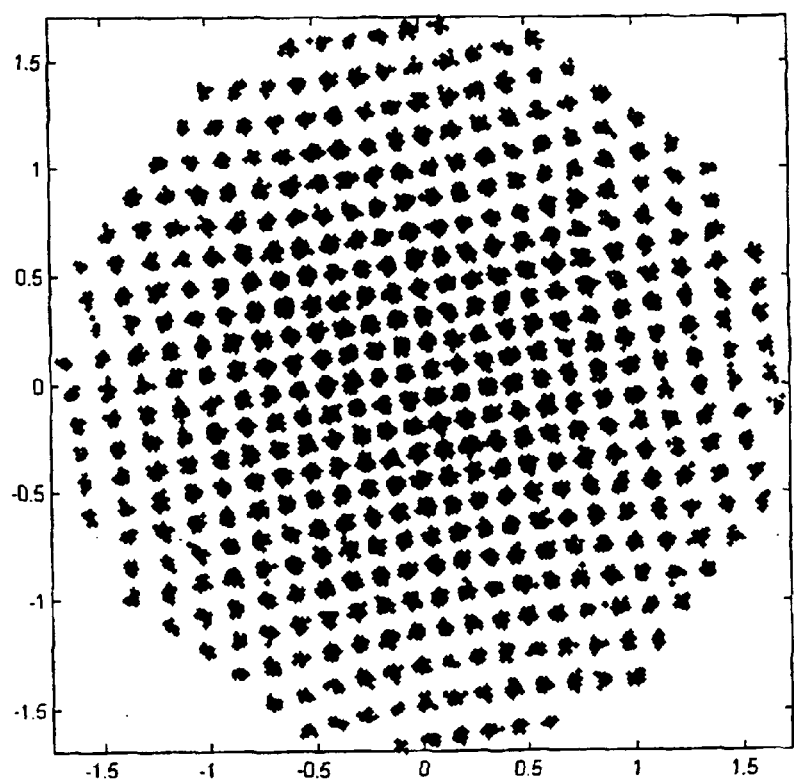
FIG. 15 is a constellation diagram illustrating an output of an adaptive MMA equalizer when receiving a 448-QAM signal.

FIG. 12 is a constellation diagram illustrating an output of a CMA equalizer when receiving an 896-QAM signal, where FIG. 13 is a constellation diagram illustrating an output of an adaptive MMA equalizer when receiving an 896-QAM signal. It is obvious that the convergence performed by the adaptive MMA equalizer is better than the conventional CMA equalizer. FIGS. 14 and 15 also show that the constellation points of a 448-QAM signal on the constellation diagram converging by means of the adaptive MMA equalizer as shown in FIG. 15 are clearly separated, and hence perform better than the CMA equalizer, shown in FIG. 14.

The adaptive equalizer implementing both the CMA algorithm and the MMA algorithm in the present invention can also receive non-linear coded signal. Non-linear encoder often multiply the signal strength with a factor to increase the distance between constellation points located further away, and decrease the distance between constellation points located closer to the centre of the constellation diagram. By multiplying the factor, the quantization error in the telephone network according to $\mu$-law and A-law is reduced. By the relationship between detected clusters and original coordinates, a transformation formula, referred to as non-linear transformation, can scale these equalized signals to their original magnitude. An example of the non-linear equation $y=ax^2+bx+c$ is a parabola, where y is an ideal receiving power, and x is a received power. The coefficients a, b, and c are found by minimizing the error function $S=\Sigma[y_i-ax^2+bx+c]$.

Figure 16A:
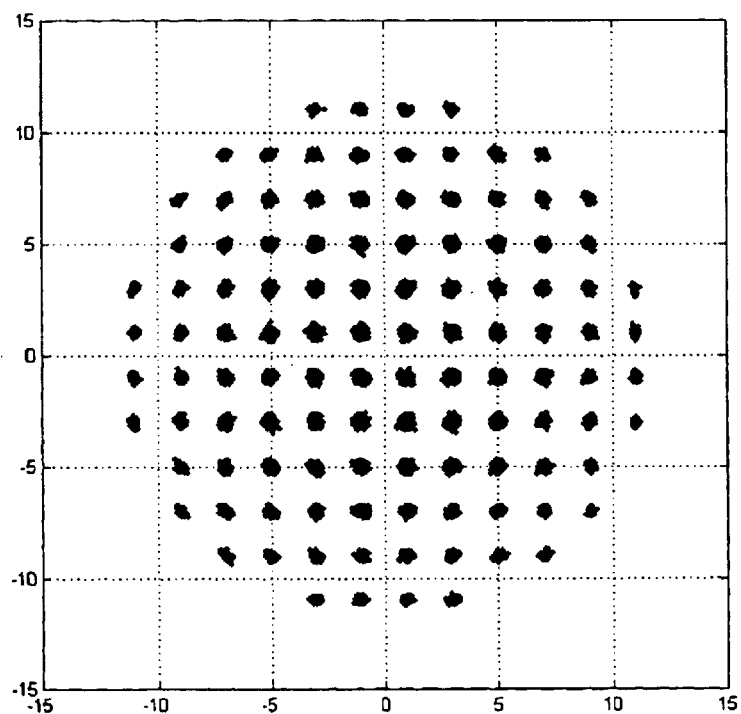
FIG. 16A is a diagram illustrating an 112-QAM signal after non-linear transformation and phase recovery.
Figure 16B:
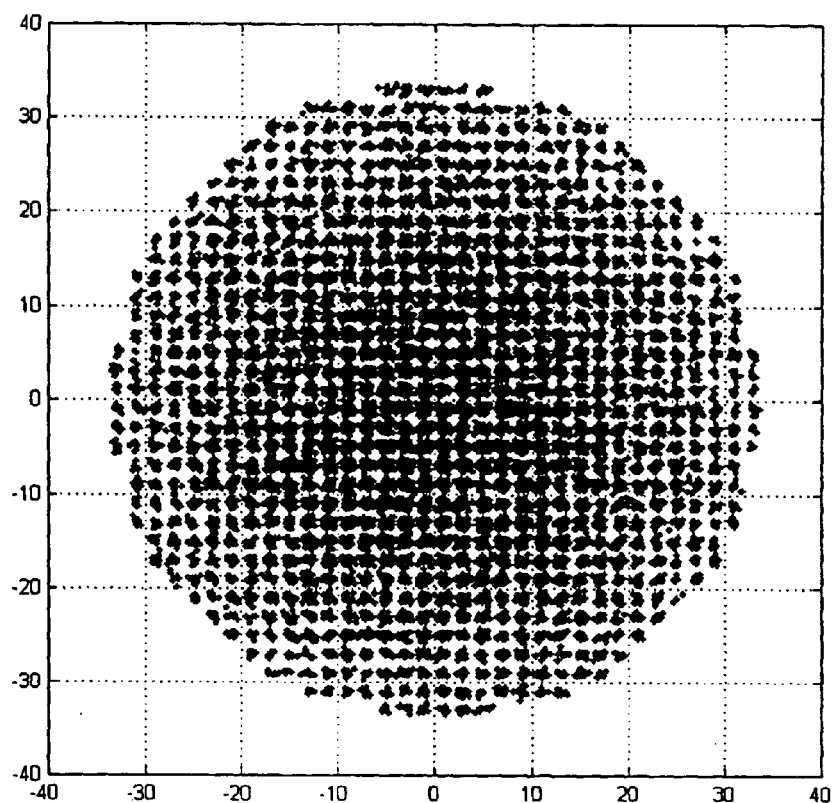
FIG. 16B is a diagram illustrating an 896-QAM signal after non-linear transformation and phase recovery.

Phase difference is induced in the received signal when the receiving end is not synchronized with the transmitting end. Neither CMA nor MMA equalizer can compensate for this phase difference. The amplitude of the signal is accurate after non-linear transformation, but there is a need to rotate the constellation diagram to compensate for the phase shift. Multiplying the received signal by an unit vector rotates the signal by the smallest angle to upright position, such as $(a+jb)$, where $a^2+b^2$, to minimize the error function $S=\Sigma[(p_i+jq_i)(a_i+jb_i)-(u_i+v_i)]^2$, where $(p_i+jq_i)$ represents coordinates of an input signal after non-linear transformation, and $(u_i+v_i)$ represents valid coordinates on the constellation diagram. FIG. 16A illustrates a 112-QAM signal after non-linear transformation and phase recovery, and FIG. 16B illustrates a 896-QAM signal after non-linear transformation and phase recovery. The signals in these two Figures are converged and located very close to the valid coordinates on the constellation diagram.

Figure 17A:
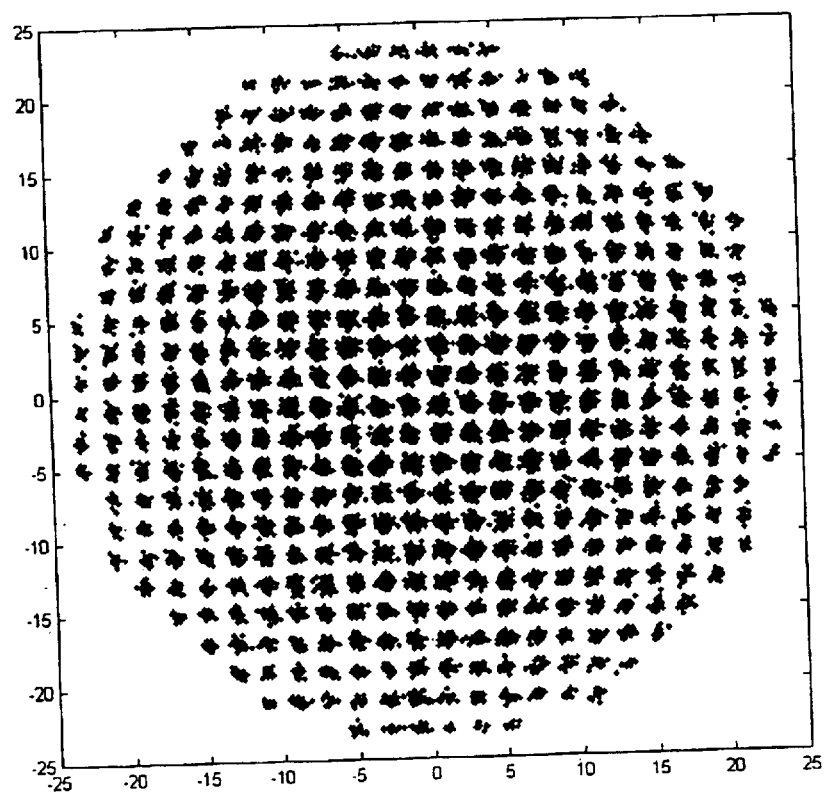
FIG. 17A is a constellation diagram illustrating a signal received before passing through the decision feedback equalizer.
Figure 17B:
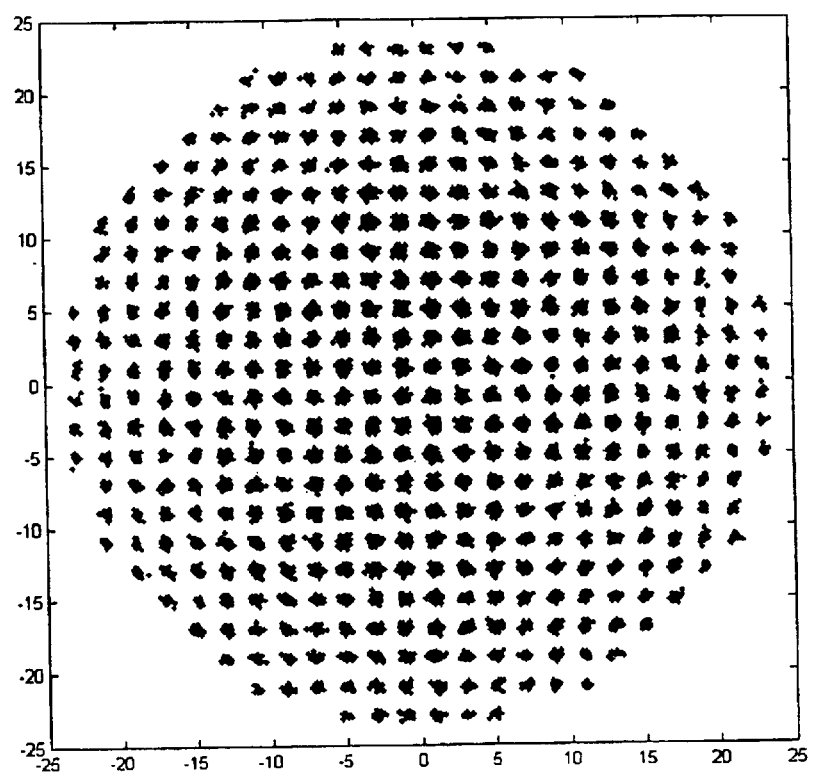
FIG. 17B is a constellation diagram illustrating a signal received after passing through the decision feedback equalizer.

Signals passing through the adaptive MMA equalizer still have some ISI, which is then regarded as noise in the signal. The remaining ISI can be removed by a decision feedback equalizer comprising a feed forward filter and a feedback filter after non-linear transformation and phase recovery. FIG. 17A is a constellation diagram illustrating a signal received before passing through the decision feedback equalizer, and FIG. 17B is a constellation diagram illustrating the received signal after passing through the decision feedback equalizer. FIGS. 17A and 17B show the decision feedback equalizer effectively removing most of the remaining ISI from the signal.

There are many advantages to the adaptive MMA equalizer disclosed in the present invention. The number of regions increases in each stage, and the rate of convergence of the tap weights is improved by more regions on the constellation diagram. The convergence performs well when the received signal is modulated to a constellation diagram with a large number of valid coordinates. The adaptive MMA equalizer is suitable for all kinds of QAM signals as the number of regions and modulus of each region are adjustable. The adaptive MMA equalizer is also applicable for signals with variable distances between constellation points on the constellation diagram. For example, V.34 protocol includes multiplying the distances between constellation points with a non-linear function. The variable distances can be recovered by adjusting the corresponding modulus during a non-linear transformation.

The foregoing descriptions of the embodiment of this invention has been presented for purposes of illustration and description. Obvious modifications or variations are possible in light of the above teaching. The embodiment was chosen and described to provide the best illustration of the principles of this invention and its practical application to thereby enable those skilled in the art to utilize the invention in varies applications. All such modifications and variations are within the scope of the present invention as determined by the appended claims when interpreted in accordance with the breadth to which they are fairly, legally, and equitably entitled.

What is claimed is:

1. An adaptive multi-modulus equalization method for an equalizer, comprising the steps of:
   storing an input signal;
   generating initial values for a plurality of equalizer coefficients;
   calculating a constant modulus algorithm (CMA) cost function output according to a CMA with an equalized signal from the equalizer;
   estimating a CMA adjustment amount for updating the equalizer coefficients according to the CMA cost function output;
   determining modulus of each region for a multi-modulus algorithm (MMA) by statistical analysis of the equalized signal;
   switching the equalizer to use the MMA when the CMA cost function output reaches a first threshold, wherein the MMA comprises a plurality of stages determined by thresholds, and the number of regions increases in each subsequent stage;
   calculating a MMA cost function output according to the MMA with the equalized signal and modulus of each region;
   estimating a MMA adjustment amount for updating the equalizer coefficients according to the MMA cost function output;
   determining modulus of each region for the subsequent stage of the MMA by statistical analysis of the equalized signal;
   switching the equalizer to the subsequent stage of the MMA when the MMA cost function output reaches the threshold corresponding to the current stage;
   repeating the steps of calculating the MMA cost function output, determining modulus of each region, and switching the equalizer to the subsequent stage until the MMA cost function output reaching a preset value; and
   fixing the number of regions and equalizer coefficients to equalize the input signal when the MMA cost function output has reached the preset value.

2. The method as claimed in claim 1 further comprising the steps of:
   phase recovering and non-linear transforming the equalized signal into a recovered signal; and
   inputting the recovered signal to a decision feedback equalizer.

3. The method as claimed in claim 1 wherein the CMA cost function output and the MMA cost function output are calculated by two second-order discrete cost functions.

4. The method as claimed in claim 1 wherein the constant modulus algorithm (CMA) is implemented by a steepest gradient descent algorithm.

5. The method as claimed in claim 1 wherein the multi-modulus algorithm (MMA) is implemented by a steepest gradient descent algorithm.

6. An adaptive multi-modulus equalizing system, comprising:
   an equalizer, generating an equalized signal from an input signal according to equalizer coefficients;
   a first coefficient generator, estimating a first adjustment amount by calculating a first cost function output according to a constant modulus algorithm (CMA);
   a second coefficient generator, estimating a second adjustment amount by calculating a second cost function output according to a multi-modulus algorithm (MMA); and
   a multiplexer connected to the equalizer, selecting either the first adjustment amount or the second adjustment amount with which to update the equalizer coefficients depending on a first threshold;
   wherein the first coefficient generator calculates the first cost function output from the input signal and the equalized signal.

7. An adaptive multi-modulus equalizing system, comprising:
   an equalizer, generating an equalized signal from an input signal according to equalizer coefficients;
   a first coefficient generator, estimating a first adjustment amount by calculating a first cost function output according to a constant modulus algorithm (CMA;
   a second coefficient generator, estimating a second adjustment amount by calculating a second cost function output according to a multi-modulus algorithm (MMA); and
   a multiplexer connected to the equalizer, selecting either the first adjustment amount or the second adjustment amount with which to update the equalizer coefficients depending on a first threshold;
   wherein the second coefficient generator calculates the second cost function output from the input signal, the equalized signal, and moduli obtained by statistical analysis of the equalized signal.

8. The system as claimed in claim 7, wherein the number of moduli used to calculate the second cost function output is incremental when the second cost function output reached a second threshold.

9. An adaptive multi-modulus equalization method for an equalizer, comprising the steps of:
   storing an input signal;
   generating initial values for a plurality of equalizer coefficients;
   calculating a constant modulus algorithm (CMA) cost function output according to a CMA with an equalized signal from the equalizer;
   estimating a CMA adjustment amount for updating the equalizer coefficients according to the CMA cost function output; and
   determining modulus of each region for a multi-modulus algorithm (MMA) by statistical analysis of the equalized signal.

10. The method as claimed in claim 9 further comprising the step of switching the equalizer to use the MMA when the CMA cost function output reaches a first threshold, wherein the MMA comprises a plurality of stages determined by thresholds, and the number of regions increases in each subsequent stage.

11. The method as claimed in claim 10 further comprising the steps of:
   calculating a MMA cost function output according to the MMA with the equalized signal and modulus of each region;

estimating a MMA adjustment amount for updating the equalizer coefficients according to the MMA cost function output; and determining modulus of each region for the subsequent stage of the MMA by statistical analysis of the equalized signal.

12. The method as claimed in claim 11 further comprising the step of switching the equalizer to the subsequent stage of the MMA when the MMA cost function output reaches the threshold corresponding to the current stage.

13. The method as claimed in claim 12 further comprising the steps of:

repeating the steps of calculating the MMA cost function output, determining modulus of each region, and switching the equalizer to the subsequent stage until the MMA cost function output reaches a preset value; and fixing the number of regions and the equalizer coefficients to equalize the input signal when the MMA cost function output has reached the preset value.

14. The method as claimed in claim 13 further comprising the steps of:

phase recovering and non-linear transforming the equalized signal into a recovered signal; and inputting the recovered signal to a decision feedback equalizer.

15. The method as claimed in claim 14 wherein the CMA cost function output and the MMA cost function output are two second-order discrete cost functions.

16. The method as claimed in claim 9 wherein the CMA is implemented by a steepest gradient descent algorithm.

17. The method as claimed in claim 9 wherein the MMA is implemented by a steepest decent algorithm.

18. An adaptive multi-modulus equalizing system, comprising:

an equalizer, generating an equalized signal from an input signal according to equalizer coefficients;

a first coefficient generator, estimating a first adjustment amount by calculating a first cost function output according to a first algorithm;

a second coefficient generator, estimating a second adjustment amount by calculating a second cost function output according to a second algorithm; and a multiplexer connected to the equalizer, selecting either the first adjustment amount or the second adjustment amount with which to update the equalizer coefficients depending on a first threshold;

wherein the second coefficient generator calculates the second cost function output from the input signal, the equalized signal, and moduli obtained by statistical analysis of the equalized signal.

19. The system as claimed in claim 18, wherein the number of moduli used to calculate the second cost function output is incremental when the second cost function output reached a second threshold.

* * * * *